(12) United States Patent
Hirasaki

(10) Patent No.: US 11,658,027 B2
(45) Date of Patent: May 23, 2023

(54) METHOD OF MANUFACTURING SEMICONDUCTOR DEVICE

(71) Applicant: SUMITOMO ELECTRIC INDUSTRIES, LTD., Osaka (JP)

(72) Inventor: Takahide Hirasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 68 days.

(21) Appl. No.: 17/338,892

(22) Filed: Jun. 4, 2021

(65) Prior Publication Data

US 2021/0398806 A1 Dec. 23, 2021

(30) Foreign Application Priority Data

Jun. 19, 2020 (JP) .............................. JP2020-105954

(51) Int. Cl.
*H01L 21/02* (2006.01)

(52) U.S. Cl.
CPC .... *H01L 21/02458* (2013.01); *H01L 21/0254* (2013.01); *H01L 21/02351* (2013.01)

(58) Field of Classification Search
CPC ......... H01L 21/02458; H01L 21/02351; H01L 21/0254; H01L 21/0272; H01L 21/0273; H01L 21/0274; H01L 21/28; H01L 21/28008; H01L 21/28575; H01L 29/41766; H01L 29/7787; H01L 29/2003; H01L 29/42316; H01L 29/66462; H01L 29/7786; H01L 29/401; G03F 7/11; G03F 7/094; G03F 7/0236; G03F 7/095; G03F 7/405; G03F 7/004
See application file for complete search history.

(56) References Cited

U.S. PATENT DOCUMENTS

| 7,429,446 | B2 | 9/2008 | Sawada et al. |
| 7,910,955 | B2 | 3/2011 | Endoh et al. |
| 9,443,740 | B1* | 9/2016 | Qiu ..................... H01L 21/0276 |
| 2005/0255696 | A1* | 11/2005 | Makiyama ................ G03F 7/40 |
| | | | 257/E21.205 |

(Continued)

FOREIGN PATENT DOCUMENTS

| JP | 2005-107116 | 4/2005 |
| WO | 2006/080109 | 8/2006 |

OTHER PUBLICATIONS

Takayoshi Abe, Tooru Kimura, Takashi Chiba, Motoyuki Shima, Shiro Kusumoto, Tsutomu Shimokawa, "Contact hole shrink process with novel chemical shrink materials," Proc. SPIE 5753, Advances in Resist Technology and Processing XXII, (May 4, 2005) (Year: 2005) (Year: 2005).*

*Primary Examiner* — Pamela H Weiss
*Assistant Examiner* — Alexander Nicholas Lee
(74) *Attorney, Agent, or Firm* — IPUSA, PLLC

(57) ABSTRACT

A method of manufacturing a semiconductor device includes: forming, on or above a GaN-based semiconductor layer, an electron beam resist containing chlorine; forming, in the electron beam resist, a first opening that exposes a portion of a surface of the semiconductor layer; forming a film of a shrink agent that covers a sidewall surface of the first opening; and forming, in a state in which the sidewall surface is covered by the film of the shrink agent, a Ni film that contacts the semiconductor layer through the first opening.

9 Claims, 15 Drawing Sheets

(56) References Cited

U.S. PATENT DOCUMENTS

| | | | | |
|---|---|---|---|---|
| 2011/0287234 | A1* | 11/2011 | Tsuchihashi | G03F 7/325 |
| | | | | 430/296 |
| 2012/0220105 | A1* | 8/2012 | Ozaki | H01L 29/66462 |
| | | | | 134/3 |
| 2015/0303291 | A1* | 10/2015 | Makiyama | H01L 21/0332 |
| | | | | 438/172 |
| 2019/0079400 | A1* | 3/2019 | Aihara | G03F 7/0035 |
| 2019/0115449 | A1* | 4/2019 | Nakano | H01L 21/02263 |
| 2020/0043717 | A1* | 2/2020 | Ueno | G03F 7/40 |

* cited by examiner

METHOD OF MANUFACTURING SEMICONDUCTOR DEVICE

CROSS-REFERENCE TO RELATED APPLICATION

The present application is based upon and claims priority to Japanese Patent Application No. 2020-105954, filed on Jun. 19, 2020, the entire contents of which are incorporated herein by reference.

BACKGROUND OF THE INVENTION

1. Field of the Invention

The present disclosure relates to a method of manufacturing a semiconductor device.

2. Description of the Related Art

As a type of semiconductor device, a high electron mobility transistor (HEMT) using a gallium nitride (GaN)-based nitride semiconductor is known. As a method of using a GaN-based nitride semiconductor to form a gate electrode of a HEMT (which may be referred to as GaN-HEMT), a method of using an electron beam resist to perform a lift-off process is disclosed (Patent Documents 1 and 2).

PRIOR ART DOCUMENT

Patent Document

[Patent Document 1] Japanese Laid-open Patent Publication No. 2005-107116
[Patent Document 2] International Publication Pamphlet No. WO 2006/080109

Semiconductor devices manufactured by conventional methods can vary in characteristics. For example, a desired threshold voltage may not be obtained.

An object of the present disclosure is to provide a method of manufacturing a semiconductor device that enables to obtain consistent characteristics.

SUMMARY OF THE INVENTION

According the present disclosure, a method of manufacturing a semiconductor device includes: forming, on or above a GaN-based semiconductor layer, an electron beam resist containing chlorine; forming, in the electron beam resist, a first opening that exposes a portion of a surface of the semiconductor layer; forming a film of a shrink agent that covers a sidewall surface of the first opening; and forming, in a state in which the sidewall surface is covered by the film of the shrink agent, a Ni film that contacts the semiconductor layer through the first opening.

According to the present disclosure, consistent characteristics can be obtained.

DESCRIPTION OF THE EMBODIMENTS

Figure 1:
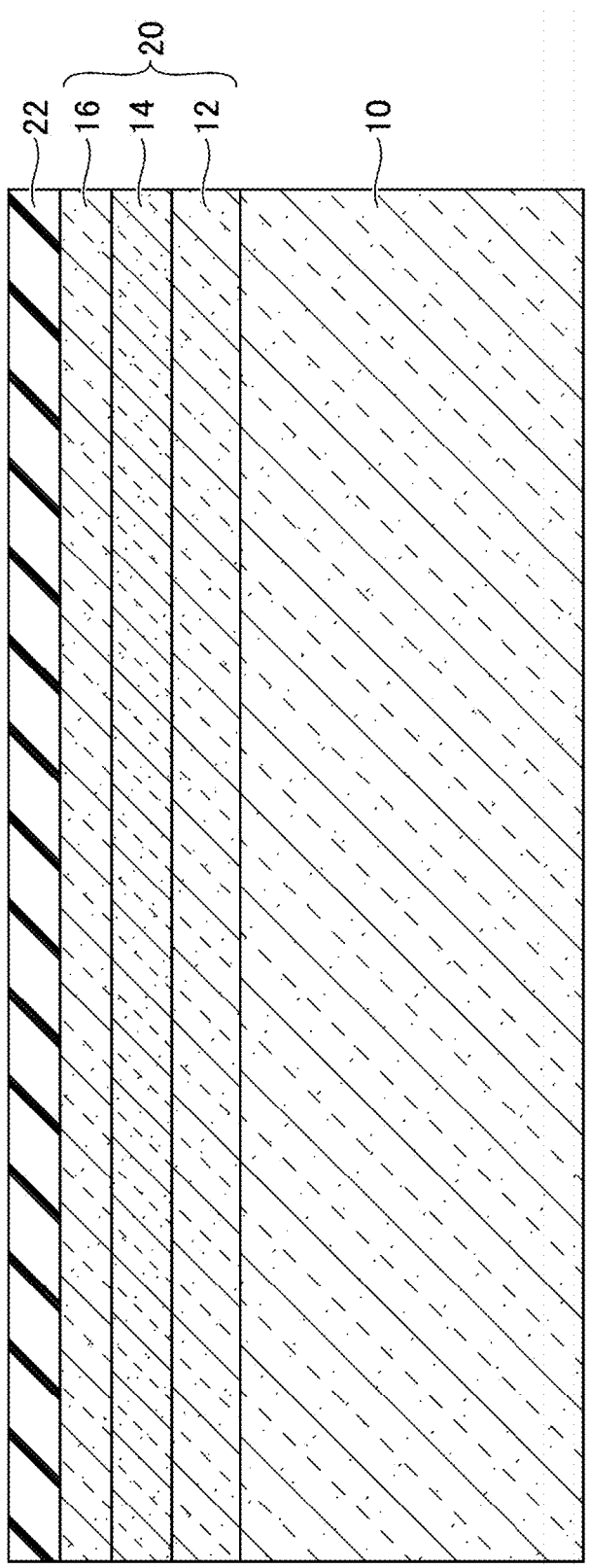
FIG. 1 is a cross-sectional view (part 1) illustrating a method of manufacturing a semiconductor device according to an embodiment.

In the following, an embodiment for carrying out will be described.

Description of Embodiment of the Present Disclosure

To begin with, aspects of the present disclosure are listed and described below. In the following description, the same reference characters are allotted to the same or corresponding elements and the same descriptions thereof are not repeated.

<1> According to one aspect of the present disclosure, a method of manufacturing a semiconductor device includes: forming, on or above a GaN-based semiconductor layer, an electron beam resist containing chlorine; forming, in the electron beam resist, a first opening that exposes a portion of a surface of the semiconductor layer; forming a film of a shrink agent that covers a sidewall surface of the first opening; and forming, in a state in which the sidewall surface is covered by the film of the shrink agent, a Ni film that contacts the semiconductor layer through the first opening.

The inventor of the present application has earnestly investigated the cause of a variation in the characteristics. As a result, it was found that corrosion may occur in a Ni film contained in a gate electrode. In addition, in order to earnestly investigate the cause of the corrosion of the Ni film, it was found that an electron beam resist used to form a gate electrode reacts with the Ni film. Then, the inventor of the present application came to the realization that by covering the surface of the electron beam resist with a film of a shrink agent before forming the Ni film, the reaction between the electron beam resist and the Ni film can be suppressed. In one aspect of the present disclosure, in a state in which a sidewall surface of a first opening is covered by the film of the shrink agent, the Ni film that contacts the semiconductor layer through the first opening is formed. Accordingly, the Ni film does not contact the electron beam resist containing chlorine, and corrosion of the Ni film can be suppressed. Therefore, it is possible to suppress a variation in characteristics due to corrosion of the Ni film and it is possible to obtain consistent characteristics.

<2> In the method according to <1>, the forming the film of the shrink agent may include applying the shrink agent to fill the first opening; curing, by baking, a portion of the shrink agent in contact with the electron beam resist; and removing an uncured portion of the shrink agent. In this case, the film of the shrink agent is easily formed.

<3> In the method according to <2>, a temperature of the baking may be 120° C. or more and 250° C. or less. In this case, it is easy to cure the shrink agent while suppressing a change in quality of the electron beam resist.

<4> In the method according to <1> to <3>, the shrink agent may contain a polyvinyl-based alcohol derivative. In this case, the film of the shrink agent is easily formed.

<5> In the method according to <1> to <4>, a width of the first opening may be 150 nm or less. In this case, the gate length can be reduced.

<6> The method according to <1> to <5> may further include forming an Au film over the Ni film after the forming the Ni film. In this case, excellent conductivity is easily obtained for the gate electrode.

<7> The method according to <6> may further include removing the electron beam resist and the shrink agent after the forming the Au film. In this case, the gate electrode of which the cross-sectional shape is a T shape is easily formed.

<8> The method according to <1> to <7> may further include, prior to the forming the electron beam resist, forming a protective film on the semiconductor layer; and forming, in the protective film, a second opening communicating with the first opening between the forming the film of the shrink agent and the forming the Ni film, wherein the Ni film may be in contact with the semiconductor layer through the first opening and the second opening. In this case, the semiconductor layer can be protected by the protective film.

<9> According to another one aspect of the present disclosure, a method of manufacturing a semiconductor device includes: forming, on a GaN-based semiconductor layer, a protective film; forming, on the protective film, an electron beam resist containing chlorine; forming, in the electron beam resist, a first opening that exposes a portion of a surface of the protective layer; forming a film of a shrink agent that covers a sidewall surface of the first opening and that contains a polyvinyl-based alcohol derivative; forming, in the protective film, a second opening communicating with the first opening; forming, in a state in which the sidewall surface is covered by the film of the shrink agent, a Ni film that contacts the semiconductor layer through the first opening and the second opening; forming an Au film over the Ni film; and removing the electron beam resist and the shrink agent after the forming the Au film, wherein a width of the first opening is 150 nm or less, and wherein the forming the film of the shrink agent includes applying the shrink agent to fill the first opening; curing, by baking at a temperature of 140° C. or more and 160° C. or less, a portion of the shrink agent in contact with the electron beam resist; and removing an uncured portion of the shrink agent.

One aspect of the present disclosure also enables that the Ni film does not contact the electron beam resist containing chlorine and corrosion of the Ni film can be suppressed. Therefore, it is possible to suppress a variation in characteristics due to corrosion of the Ni film and it is possible to obtain consistent characteristics.

Details of Embodiments of the Present Disclosure

Embodiments of the present disclosure will be described in detail, but the present embodiments are not limited to the specifics as descried. It should be noted that in the specification and the drawings in the present application, the same reference characters are allotted to elements having substantially the same functions such that duplicate descriptions may be omitted.

The present embodiment relates to a method of manufacturing a semiconductor device including a GaN-HEMT having a nitride semiconductor as the main component. FIG. 1 to FIG. 12 are cross-sectional views illustrating a method of manufacturing a semiconductor device according to the embodiment.

First, as illustrated in FIG. 1, a layered structure 20 including a plurality of nitride semiconductor layers is grown on a substrate 10 using a metal-organic chemical vapor deposition (MOCVD) method. The substrate 10 may be, for example, a SiC substrate having a (0001) principal surface, and the layered direction of the layered structure 20 is a direction, for example. The layered structure 20 includes an electron transit layer 12, an electron supply layer 14, and a cap layer 16 that are sequentially formed from the substrate 10 side. The electron transit layer 12 may be, for example, an undoped GaN layer having a thickness of 1000 nm. The electron supply layer 14 may be, for example, an n-type AlGaN layer having a thickness of 20 nm. The cap layer 16 may be, for example, an n-type GaN layer having a thickness of 5 nm. Next, as illustrated in FIG. 1, a protective film 22 that contacts the upper surface of the layered structure 20 is deposited using a plasma CVD method. The protective film 22 may be, for example, a SiN film having a thickness of 100 nm. The deposition temperature of the protective film 22 may be, for example, 200° C. to 400° C. Also, for example, ammonia gas and silane ($SiH_4$) may be used as the raw material gasses for the protective film 22. Prior to forming the electron transit layer 12, a nucleation layer may be formed on the substrate 10, and the electron transit layer 12 may be formed on the nucleation layer. The nucleation layer may be, for example, an AlN layer having a thickness of several tens of nm.

Figure 2:
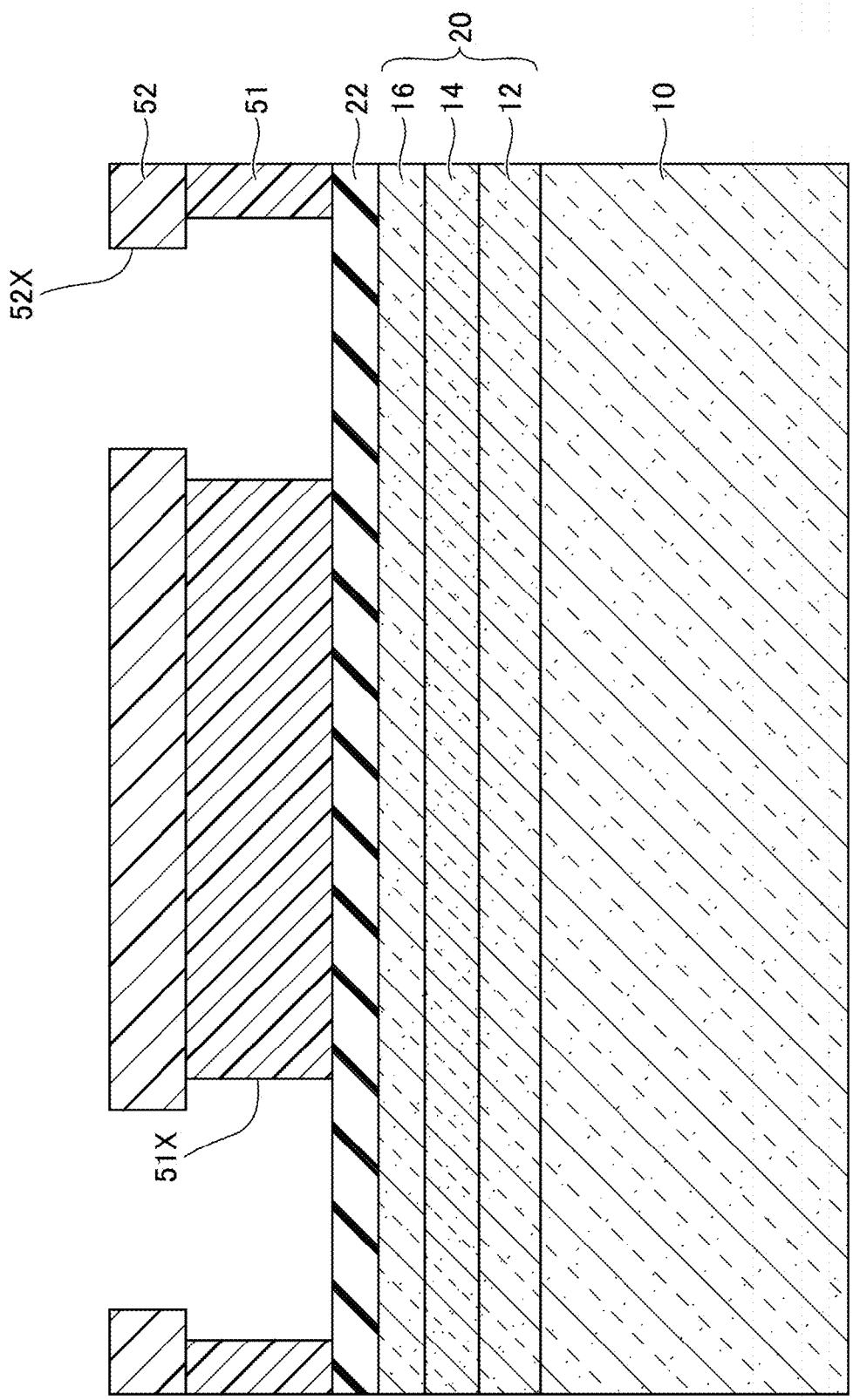
FIG. 2 is a cross-sectional view (part 2) illustrating the method of manufacturing a semiconductor device according to the embodiment.

Next, as illustrated in FIG. 2, a photoresist 51 and a photoresist 52 are applied on the protective film in this order. For example, the material of the photoresist 51 may be polymethylglutarimide (PMGI) and the photoresist 52 may be i-line resist. Next, by photolithography, an opening 52X is formed in the photoresist 52 and an opening 51X is formed in the photoresist 51. The protective film 22 is exposed through the openings 52X and 51X.

Figure 3:
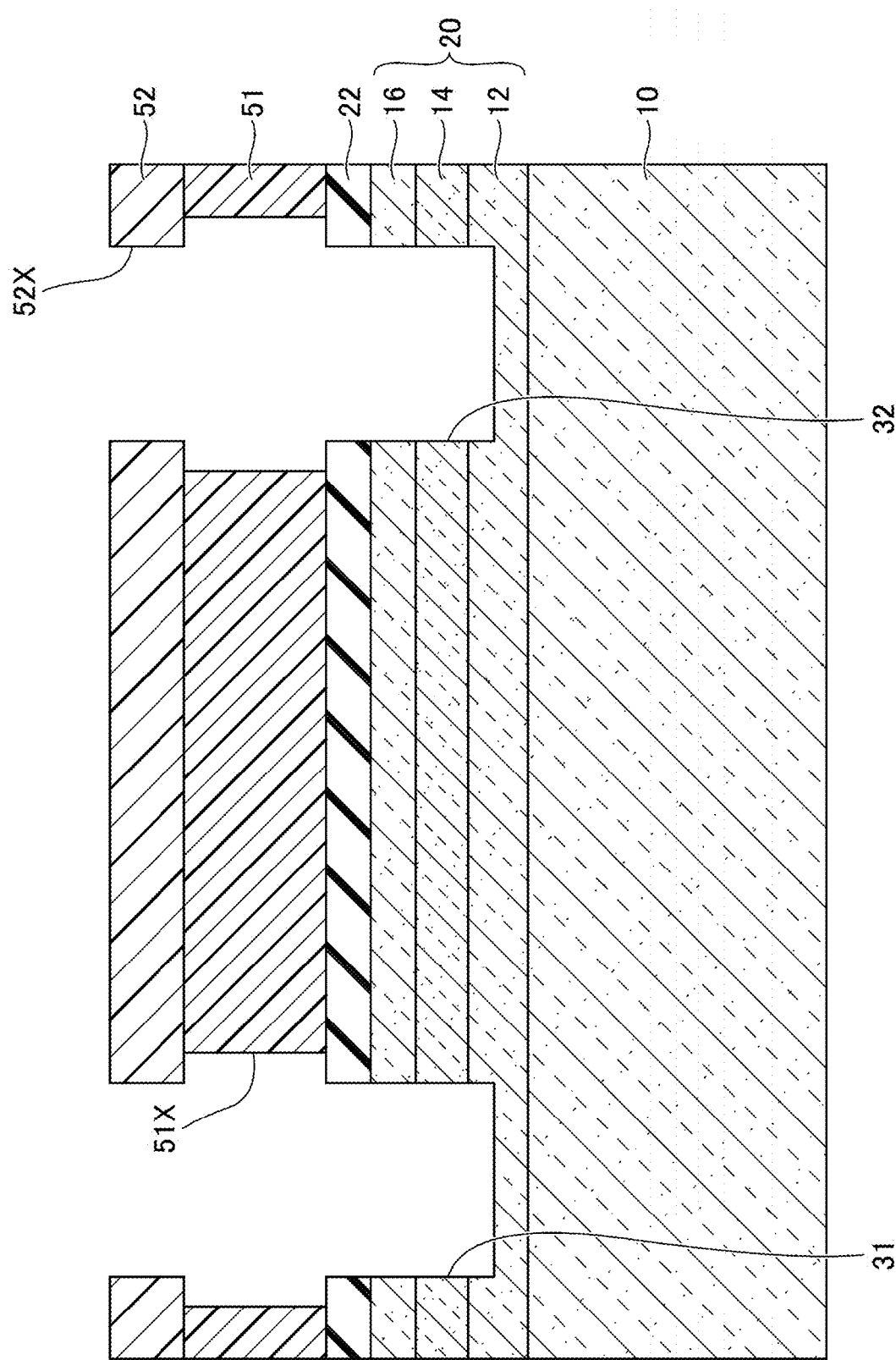
FIG. 3 is a cross-sectional view (part 3) illustrating the method of manufacturing a semiconductor device according to the embodiment.

Next, as illustrated in FIG. 3, with the photoresists 51 and 52 as a mask, an opening 31 for source and an opening 32 for drain are formed in the protective film 22 and the layered structure 20 by reactive ion etching (RIE). For example, the etching of the protective film 22 uses a reactive gas containing fluorine (F) and the etching of the layered structure 20 uses a reactive gas containing chlorine (Cl).

Figure 4:
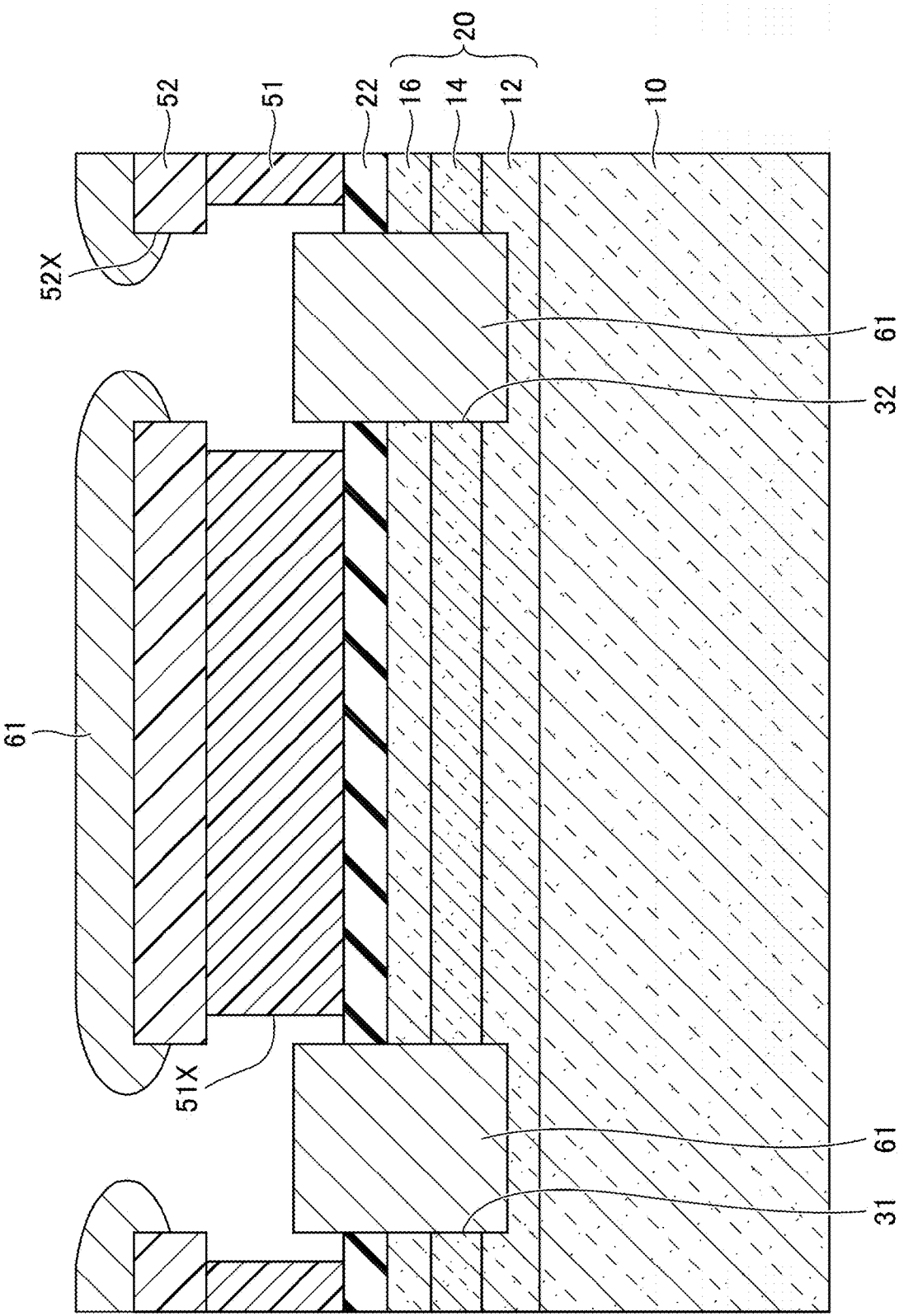
FIG. 4 is a cross-sectional view (part 4) illustrating the method of manufacturing a semiconductor device according to the embodiment.

Then, as illustrated in FIG. 4, a metal layer 61 is formed inside the opening 31 and inside the opening 32 by a deposition method. The metal layer 61 also adheres to the upper surface of the photoresist 52 and to the side wall surface of the opening 52X. The metal layer 61 includes, for example, a Ta film, an Al film, and a Mo film formed sequentially from the substrate 10 side.

Figure 5:
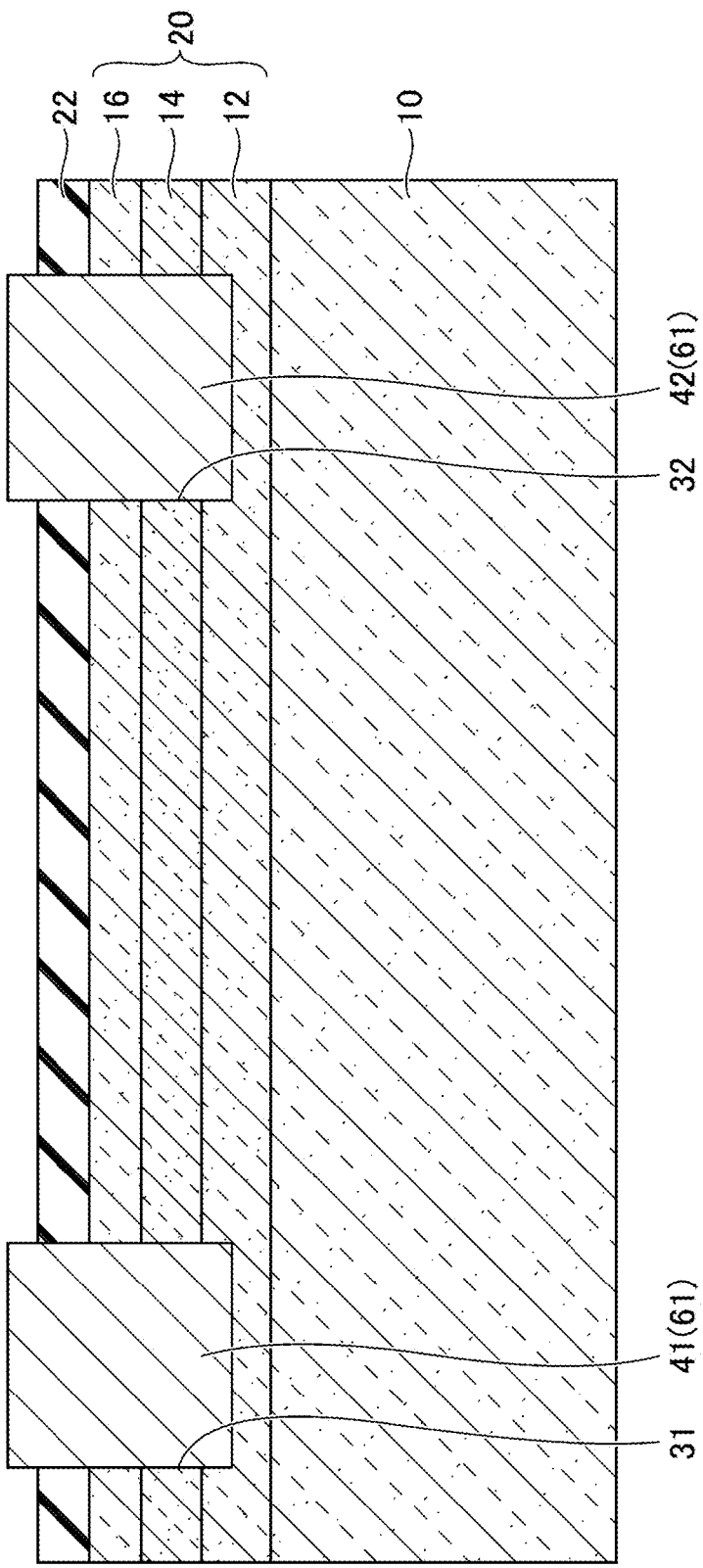
FIG. 5 is a cross-sectional view (part 5) illustrating the method of manufacturing a semiconductor device according to the embodiment.

The photoresist 51 and 52 are then removed, as illustrated in FIG. 5. With removal of the photoresist 52, the portions of the metal layer 61 adhering to the photoresist 52 are also removed. On the other hand, the metal layer 61 remains inside the openings 31 and 32. That is, a lift-off process is performed. The metal layer 61 is then alloyed by a heat treatment. Thus, a source electrode 41 that is in ohmic contact with the layered structure 20 is formed in the opening 31, and a drain electrode 42 that is in ohmic contact with the layered structure 20 is formed in the opening 32.

Figure 6:
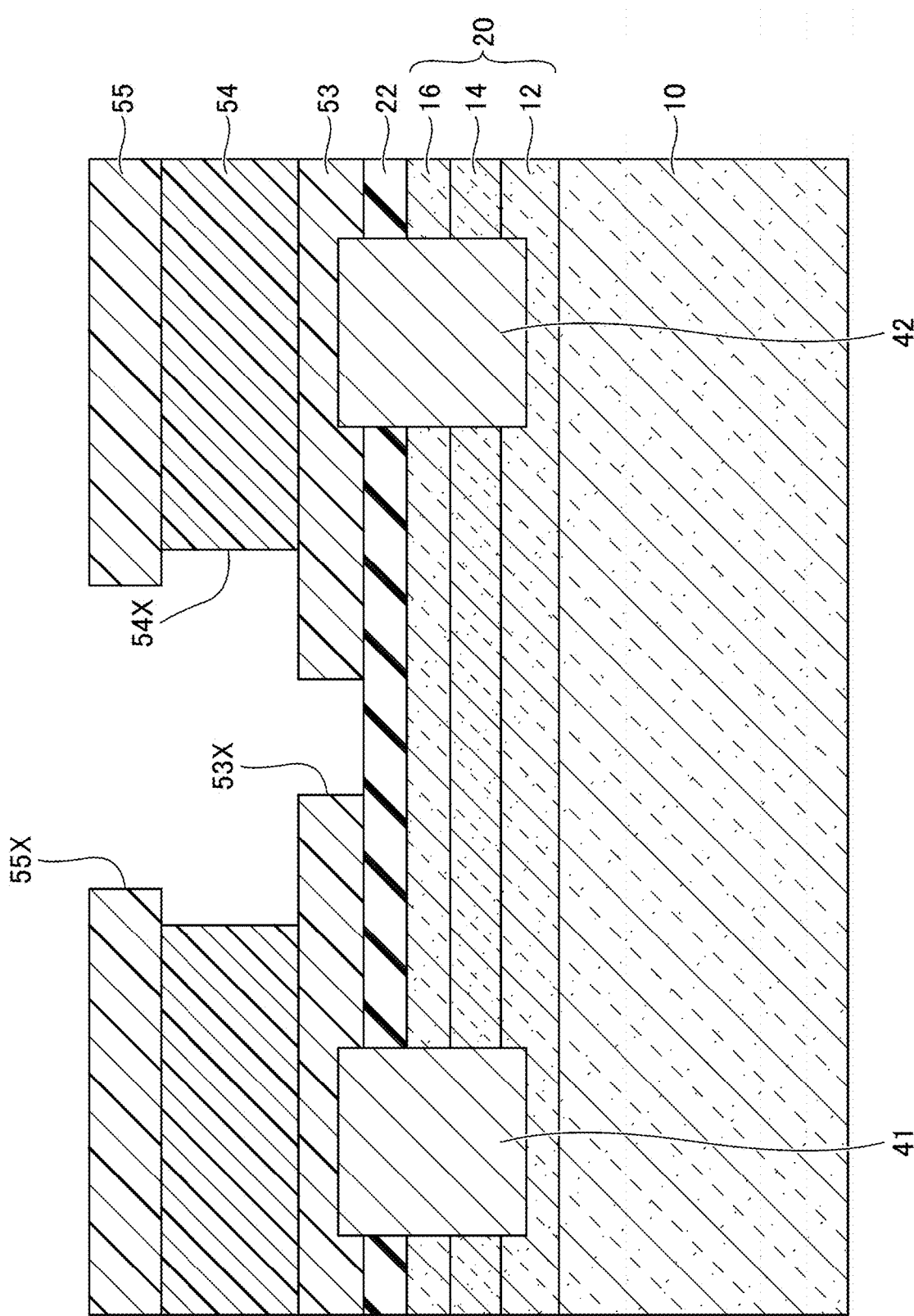
FIG. 6 is a cross-sectional view (part 6) illustrating the method of manufacturing a semiconductor device according to the embodiment.

Then, as illustrated in FIG. 6, an electron beam resist 53, an electron beam resist 54, and an electron beam resist 55 are applied in this order over the protective film 22, the source electrode 41, and the drain electrode 42. Electron beam resists are resists that are exposed by electron beams. For example, the electron beam resists 53 and 55 may be a copolymer of α-chloroacrylate and α-methylstyrene and contain chlorine. For example, ZEP520A, manufactured by Zeon Corporation, may be used as the electron beam resists 53 and 55, and the material of the electron beam resist 54 may be polymethylglutarimide (PMGI). The electron beam resists 53 and 55 can be processed more finely than the electron beam resist 54. By electron beam lithography, an opening 55X is formed in the electron beam resist 55, an opening 54X is formed in the electron beam resist 54, and an opening 53X is formed in the electron beam resist 53. For example, the width of the opening 53X, i.e., the longitudinal dimension of the gate, may be 150 nm or less, and may be preferably 120 nm or Less. The protective film 22 is exposed through the openings 55X, 54X, and 53X. The opening 53X is an example of a first opening.

Figure 7:
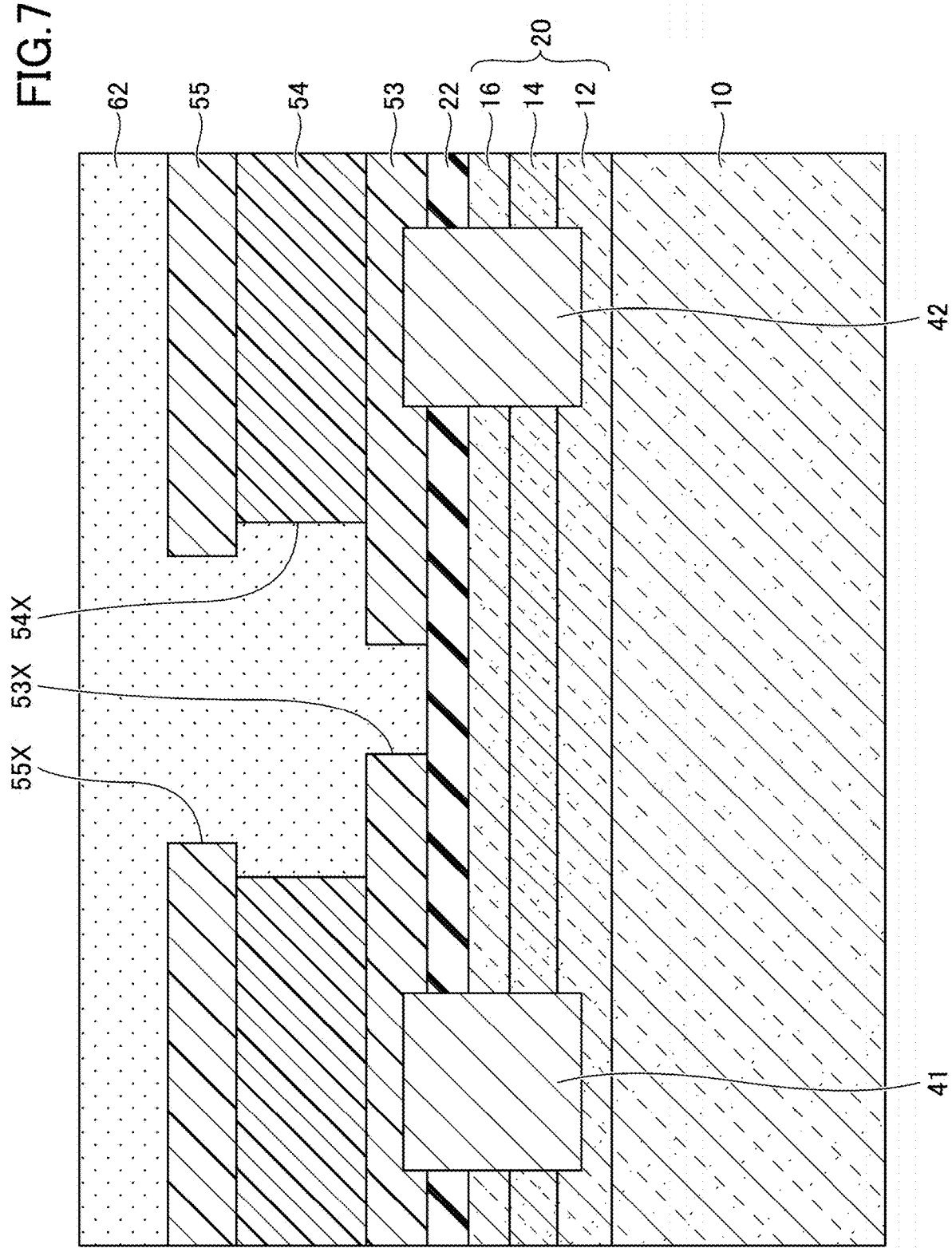
FIG. 7 is a cross-sectional view (part 7) illustrating the method of manufacturing a semiconductor device according to the embodiment.

Next, as illustrated in FIG. 7, a shrink agent 62 is applied over the electron beam resists 53 to 55 to fill the openings 55X, 54X and 53X. For example, the shrink agent 62 contains a polyvinyl-based alcohol derivative. As the shrink agent 62, for example, a shrink agent may be used to narrow the opening width of the photoresist in photolithography using an i-line or KrF excimer laser. Generally, in a case in which such a shrink agent is used in photolithography using an i-line or KrF excimer laser, baking is performed at a temperature of 100° C. or lower to cure the shrink agent. It should be noted that, in electron beam lithography, because a sufficiently fine pattern can be easily formed without using a shrink agent, a shrink agent is not used.

Figure 8:
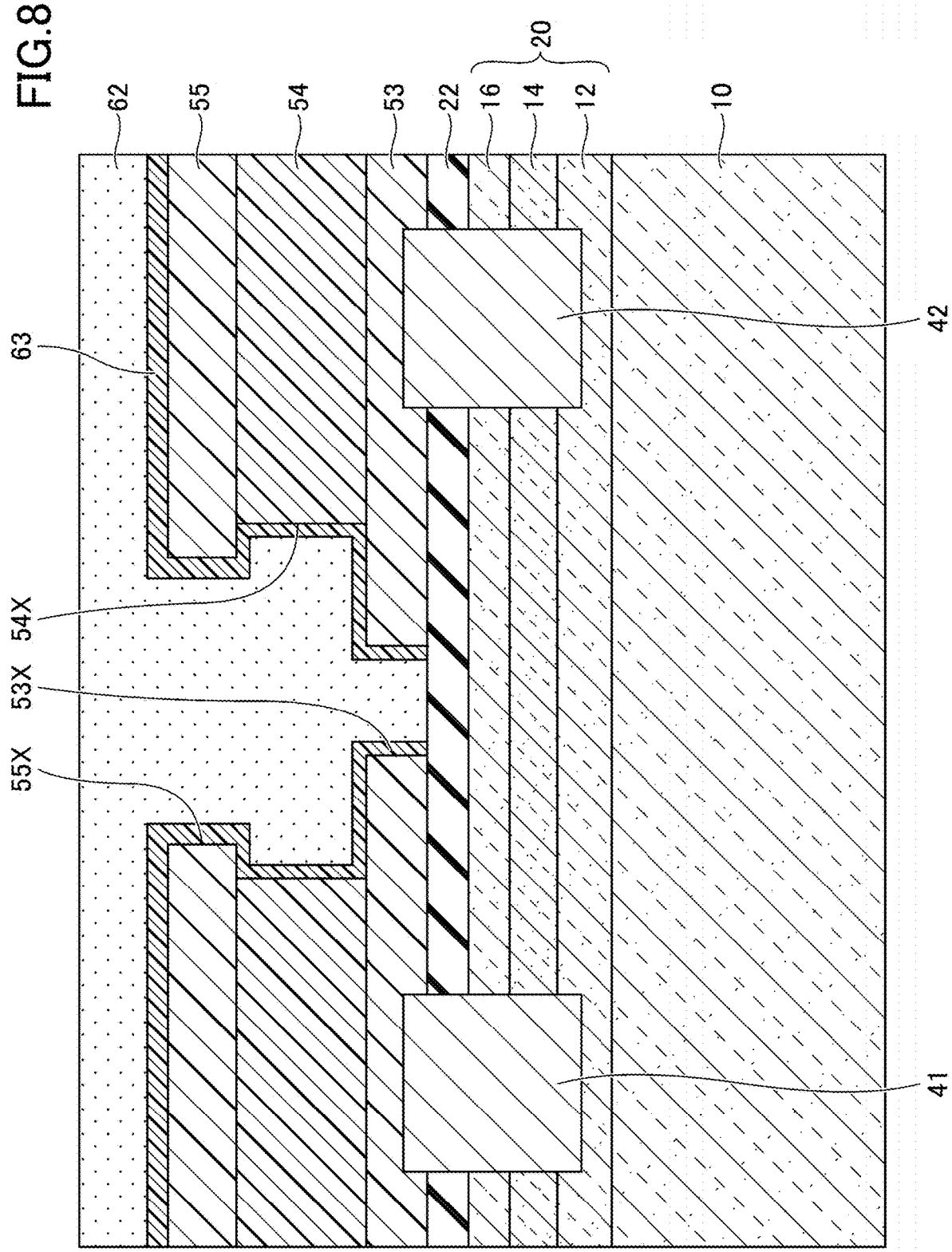
FIG. 8 is a cross-sectional view (part 8) illustrating the method of manufacturing a semiconductor device according to the embodiment.

Next, as illustrated in FIG. 8, the portion of the shrink agent 62 in contact with the electron beam resists 53 to 55 is cured by baking to form a film 63 of the shrink agent that covers the sidewall surfaces of the openings 53X to 55X. At this time, a portion of the protective film 22 remains exposed from the openings 53X to 55X. The upper surface of the electron beam resist 55 may also be covered by the film 63 of the shrink agent. The temperature of the baking may be, for example, 120° C. or more and 250° C. or less. In general, when an electron beam resist is irradiated with an electron beam, a copolymer is monomerized to generate α-chloroacrylate, but the acidity of the electron beam resist after being irradiated with the electron beam is lower than the acidity of photoresist. Therefore, when the temperature of the baking is too low, the shrink agent 62 is difficult to polymerize and the shrink agent 62 is difficult to cure. Also, when the temperature of the baking is too high, the electron beam resists 53 to 55 may change in quality, or the opening 53X may be filled with the film 63 by excessive curing. The temperature of the baking is more preferably 140° C. or more and 160° C. or less.

Figure 9:
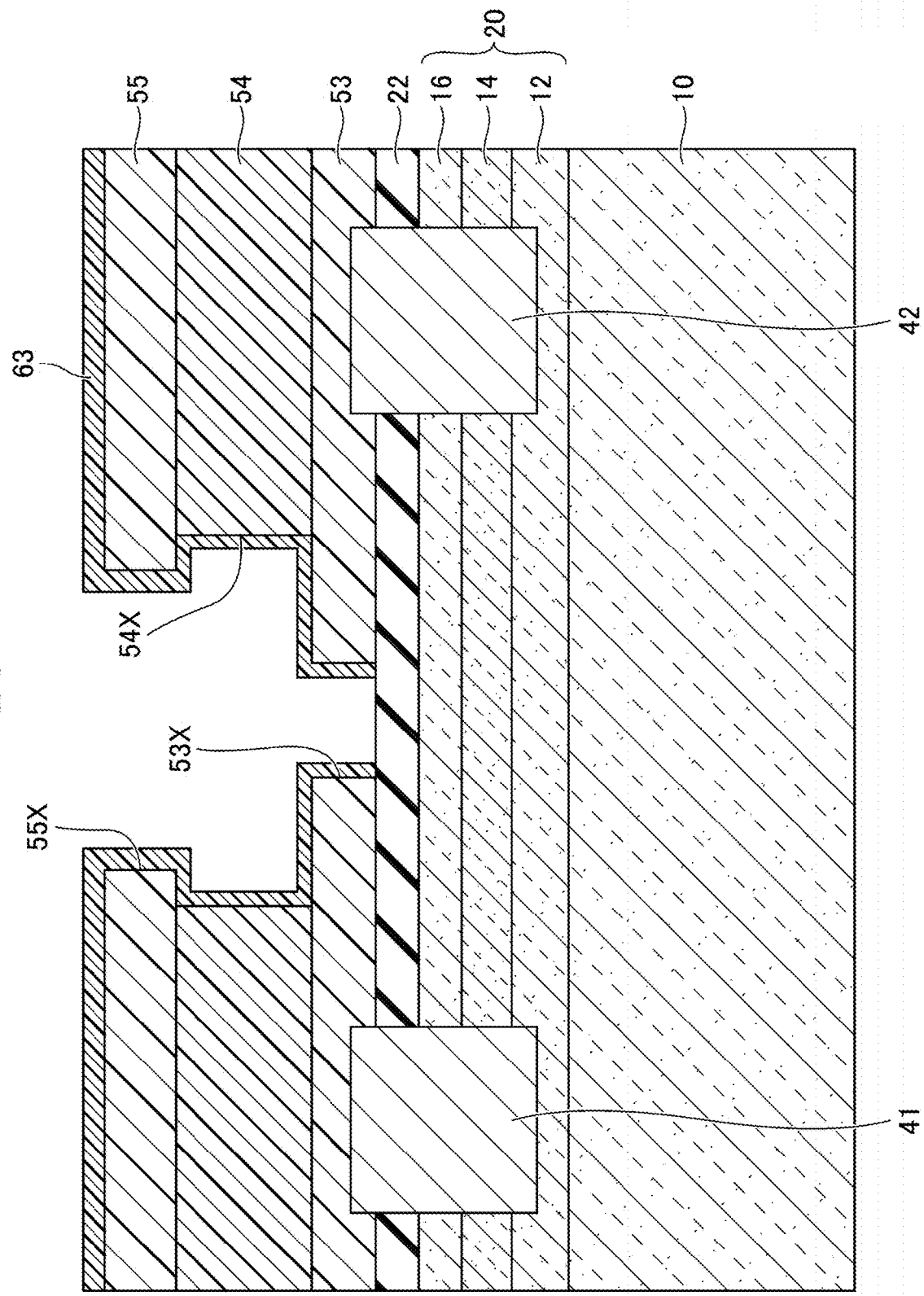
FIG. 9 is a cross-sectional view (part 9) illustrating the method of manufacturing a semiconductor device according to the embodiment.

Next, as illustrated in FIG. 9, the uncured portion of the shrink agent 62 is removed. That is, within the shrink agent 62, while leaving the film 63 cured and polymerized by baking, the uncured portion, which is not cured/polymerized by even baking, is removed. In a case in which the shrink agent 62 is water soluble, the uncured portion can be removed using, for example, pure water.

Figure 10:
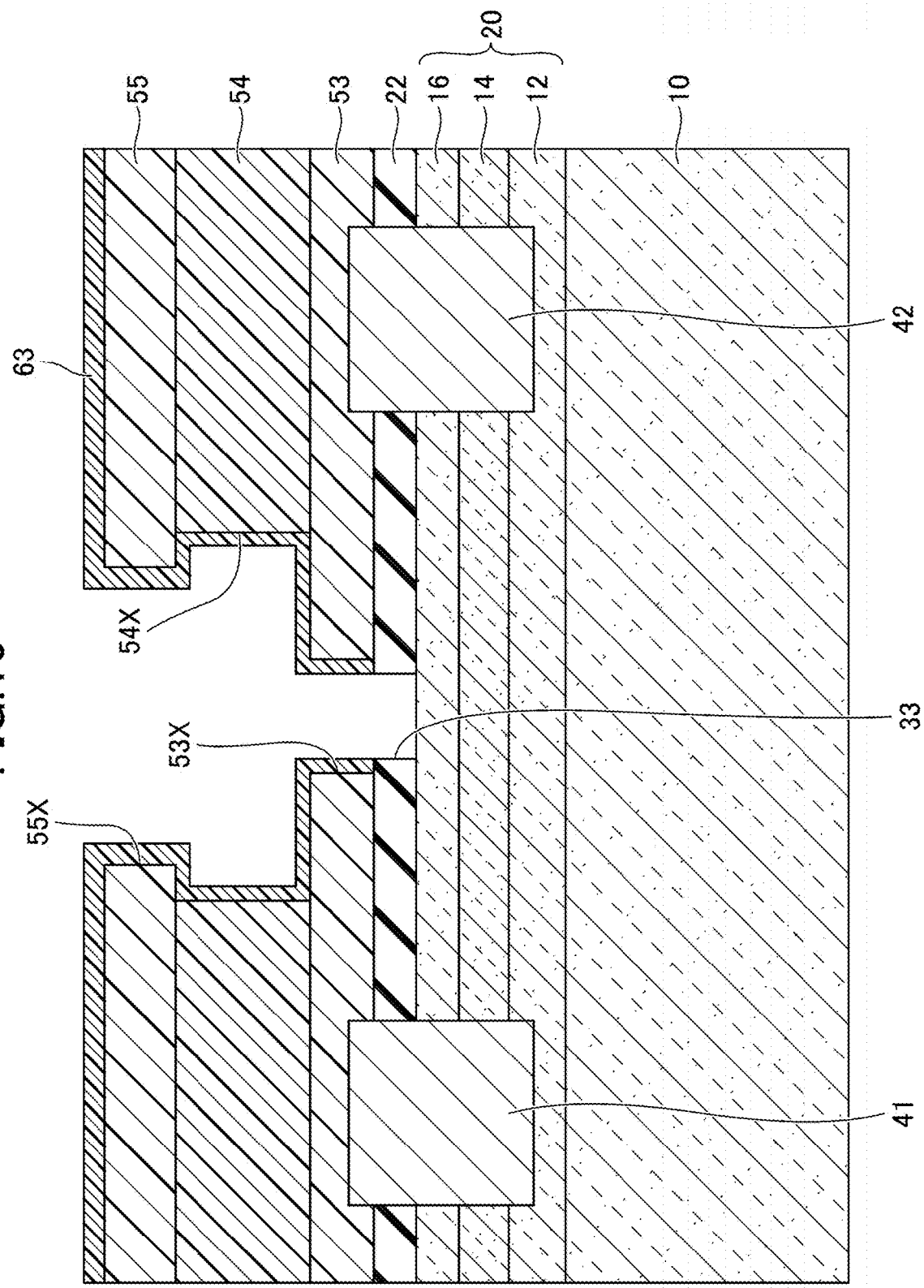
FIG. 10 is a cross-sectional view (part 10) illustrating the method of manufacturing a semiconductor device according to the embodiment.

Next, as illustrated in FIG. 10, with the electron beam resists 53 to 55 as a mask, an opening 33 for gate is formed in the protective film 22 by RIE and a reactive gas containing fluorine. The opening 33 is an example of a second opening.

Figure 11:
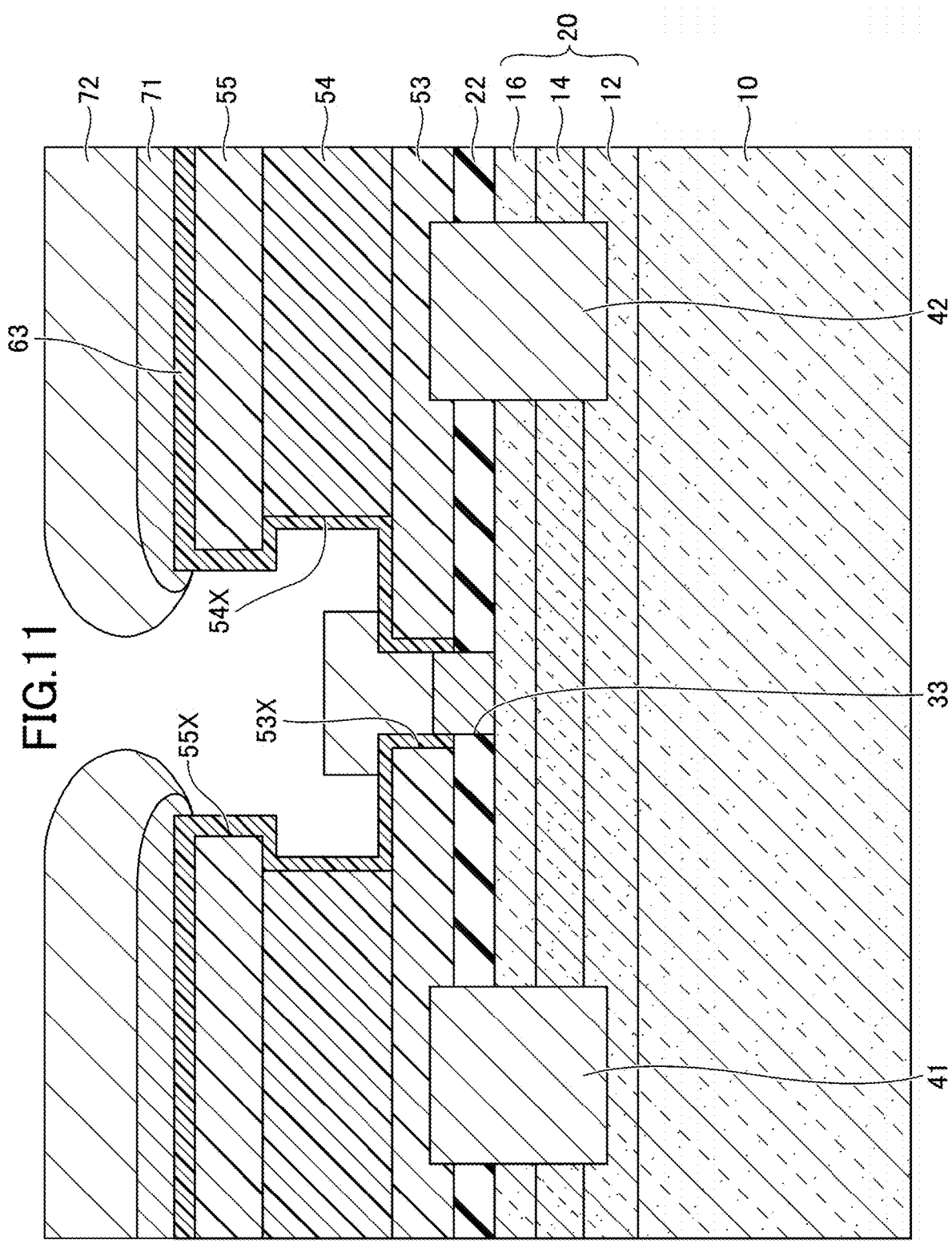
FIG. 11 is a cross-sectional view (part 11) illustrating the method of manufacturing a semiconductor device according to the embodiment.

Then, as illustrated in FIG. 11, a Ni film 71 is formed inside the opening 33 by a deposition method. The Ni film 71 also adheres to the film 63 on the upper surface of the electron beam resist 55 and on the sidewall surface of the opening 55X. Further, an Au film 72 is formed on the Ni film 71 by a deposition method. The Au film 72 is formed on the upper surface of the electron beam resist 53 to spread over the film 63.

Figure 12:
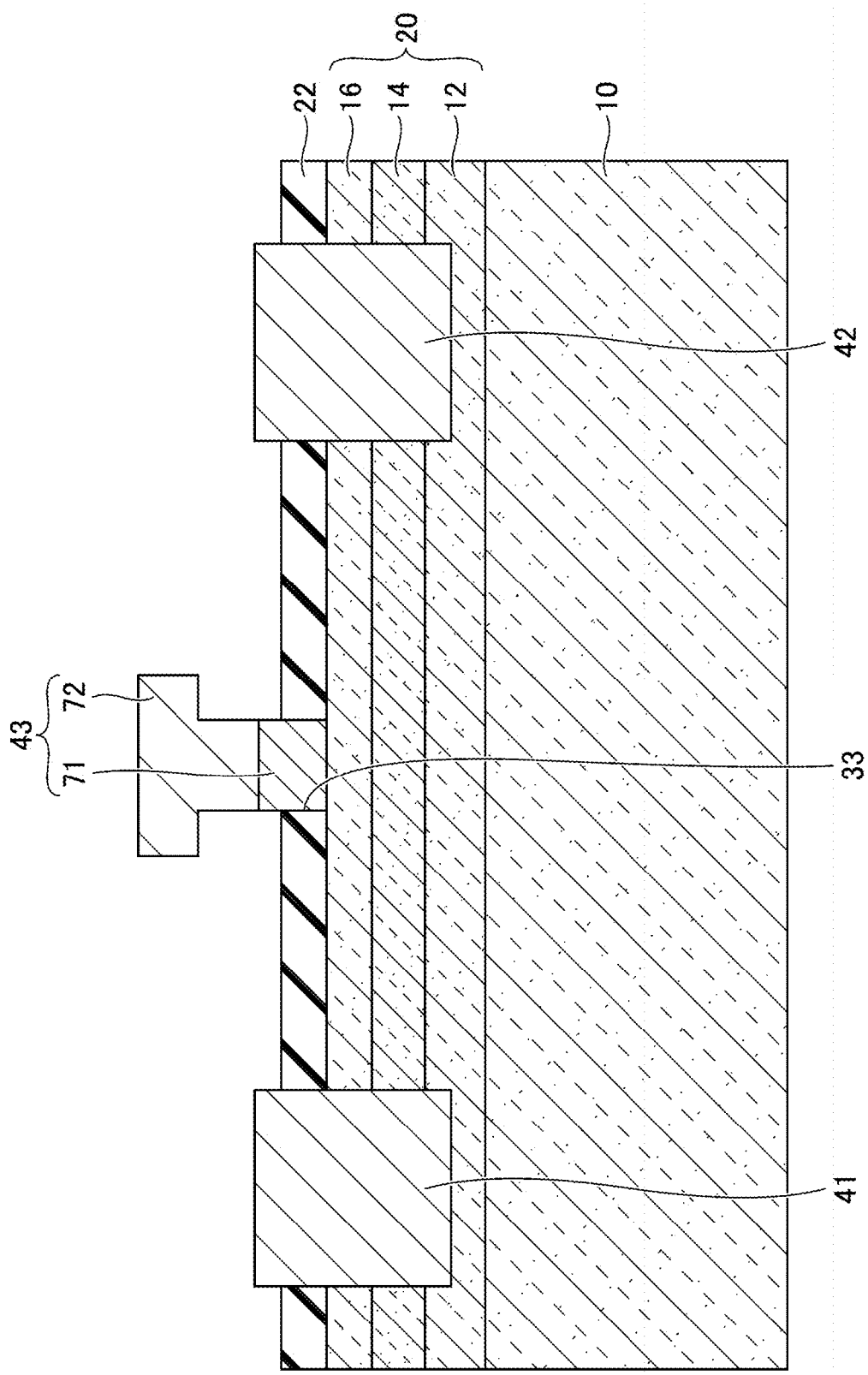
FIG. 12 is a cross-sectional view (part 12) illustrating the method of manufacturing a semiconductor device according to the embodiment.

The electron beam resists 53 to 55 and the film 63 of the shrink agent are then removed, as illustrated in FIG. 12. The electron beam resists 53 to 55 and the film 63 can be removed using, for example, an organic solvent. With the removal of the electron beam resists 53 to 55 and the film 63, the portion of the Ni film 71 adhering to the film 63 formed on the electron beam resist 55 and the Au film 72 thereon are also removed. On the other hand, inside the opening 33, the Ni film 71 remains and the Au film 72 also remains on the Ni film 72. That is, a lift-off process is performed. Thereby, a gate electrode 43 including the Ni film 71 and the Au film 72 and making Schottky contact with the layered structure 20 through the opening 33 is formed. For example, the gate electrode 43 has a T shape in a cross-sectional view.

Thereafter, wiring or the like is formed as necessary. In this manner, a semiconductor device including a GaN-HEMT can be manufactured.

In the present embodiment, in a state in which the sidewall surface of the opening 53X is covered by the film 63 of the shrink agent, the Ni film 71 that contacts the layered structure 20 through the opening 53X is formed. Thus, the Ni film 71 does not contact the electron beam resist 53 containing chlorine and corrosion of the Ni film 71 can be suppressed. Accordingly, it is possible to suppress a decrease and a variation in the characteristics due to the corrosion of the Ni film 71.

When forming the film 63, by applying the shrink agent 62, baking, and removing the uncured portion, the film 63 is easily formed. By using the shrink agent 62 containing a polyvinyl-based alcohol derivative, the film 63 is easily formed.

By making the width of the opening 53X to be less than or equal to 150 nm, the gate length can be shortened. The width of the opening 53X is preferably 120 nm or less.

By forming the Au film 72 on the Ni film 71 after forming the Ni film 71, excellent conductivity can be obtained for the gate electrode 43. By removing the electron beam resists 53 to 55 and the film 63 after forming the Au film 72, a gate electrode 43 of which the cross-sectional shape is a T shape is easily formed.

Because the protective film 22 is formed before the electron beam resists 53 to 55 are formed, the opening 33 is formed in the protective film 22, and the Ni film 71 is in contact with the layered structure 20 through the opening 53X and the opening 33, the layered structure 20 can be protected by the protective film 22. For example, degradation of characteristics such as current collapse can be suppressed.

Next, the experiments on corrosion of a Ni film performed by the inventor of the present invention will be described. In the experiments, an electron beam resist containing chlorine (ZEP520A manufactured by Zeon Corporation) was formed on a substrate, and thereafter a Ni film and an Au film were formed by a deposition method. In the first condition, the Ni film was formed on the electron beam resist. In the second condition, a shrink agent containing a polyvinyl-based alcohol derivative was applied to the electron beam resist, baking was performed at 130° C. for 90 seconds to cure the shrink agent to form a film, and the Ni film was formed on the film. In the third condition, a shrink agent containing a polyvinyl-based alcohol derivative was applied to the electron beam resist, baking was performed at 150° C. for 90 seconds to cure the shrink agent to form a film, and the Ni film was formed on the film. In the first condition, the lower surface of the Ni film is in direct contact with the upper surface of the electron beam resist. In the second condition and the third condition, the film of the shrink agent is interposed between the electron beam resist and the Ni film.

Figure 13:
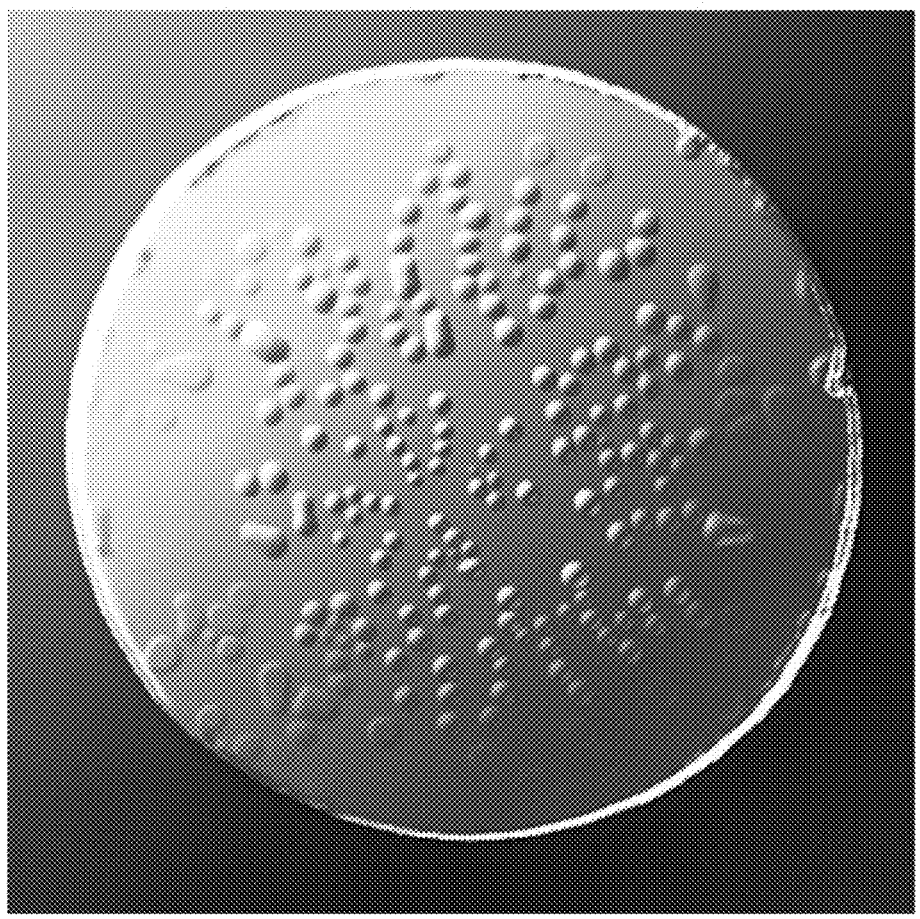
FIG. 13 is a diagram illustrating an observed image of a sample prepared under a first condition.
Figure 14:
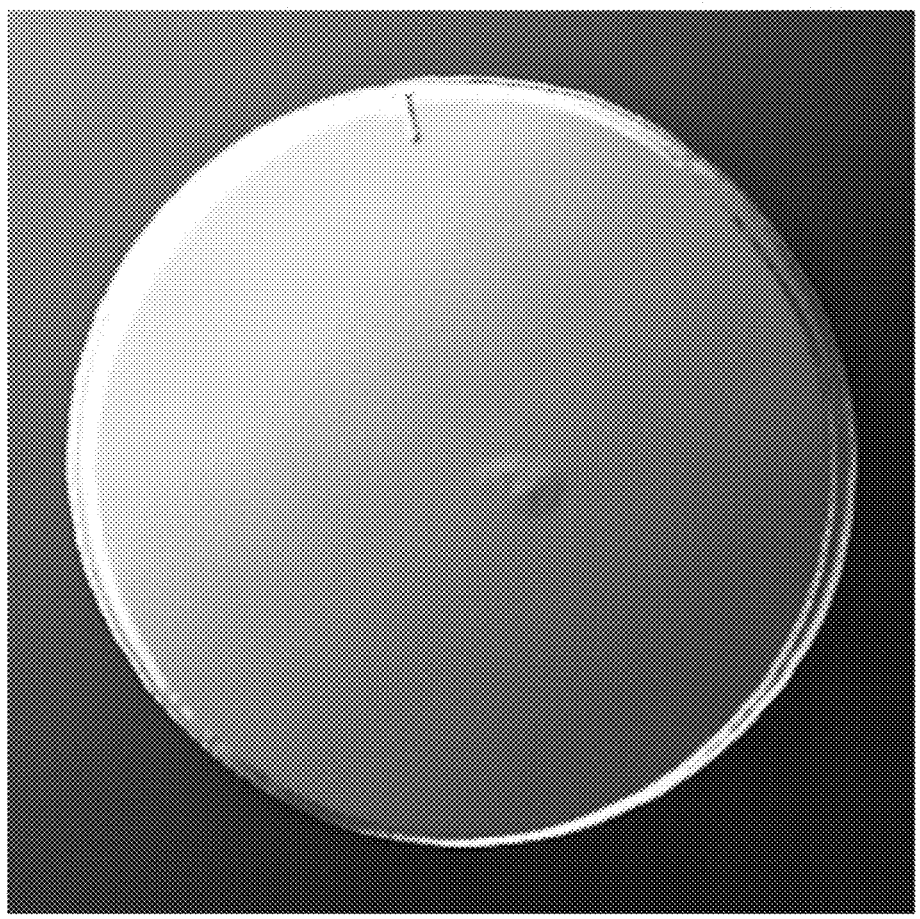
FIG. 14 is a diagram illustrating an observed image of a sample prepared under a second condition.
Figure 15:
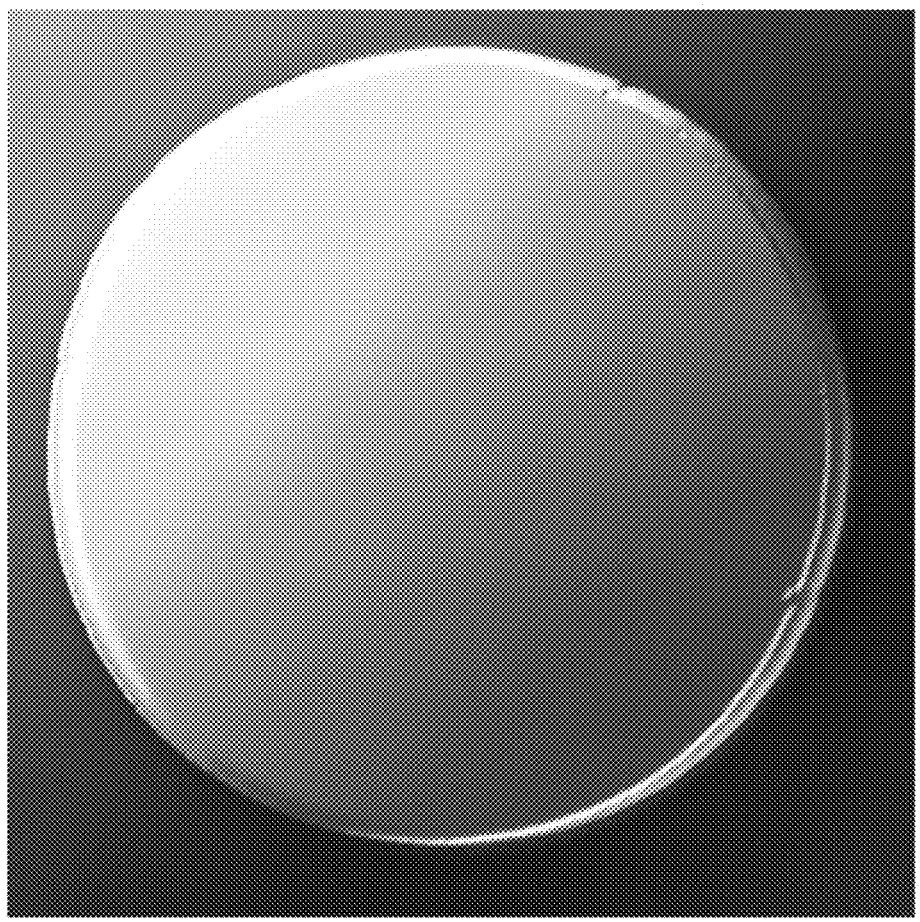
FIG. 15 is a diagram illustrating an observed image of a sample prepared under a third condition.

The samples of the respective conditions were then viewed using a Nomarski microscope. The observed images are illustrated in FIG. 13 to FIG. 15. FIG. 13 is a diagram illustrating the observed image of the sample prepared under the first condition. FIG. 14 is a diagram illustrating the observed image of the sample prepared under the second condition. FIG. 15 is a diagram illustrating the observed image of the sample prepared under the third condition.

As illustrated in FIG. 13, corrosion was observed at a large number of points in the sample prepared under the first condition. As illustrated in FIG. 14, almost no corrosion was observed in the sample prepared under the second condition. As illustrated in FIG. 15, no corrosion was observed in the sample prepared under the third condition. From these results, the temperature of the baking is preferably 120° C. or more and is and more preferably 140° C. or more.

Although the embodiment has been described in detail above, the present disclosure is not limited to a specific embodiment, and various modifications and changes can be made within the scope of the claims.

What is claimed is:

1. A method of manufacturing a semiconductor device, the method comprising:
   forming, on or above a GaN-based semiconductor layer, a first electron beam resist, a second electron beam resist, and a third electron beam resist, at least one of the first electron beam resist and the third electron beam resist containing chlorine;
   forming a first opening in the first electron beam resist, a second opening in the second electron beam resist, and a third opening in the third electron beam resist, wherein the first opening exposes a portion of a surface of the semiconductor layer, the second opening is larger in width than the first opening, and the third opening is larger in width than the first opening and smaller in width than the second opening;
   forming a film of a shrink agent that covers an upper surface of the third electron beam resist and each of sidewall surfaces of the first opening, the second opening, and the third opening; and
   forming, in a state in which the sidewall surfaces are covered by the film of the shrink agent, a Ni film that contacts the semiconductor layer through the first opening.

2. The method of manufacturing a semiconductor device according to claim 1,
   wherein the forming the film of the shrink agent includes
      applying the shrink agent to fill the first opening, the second opening, and the third opening, and to cover the upper surface of the third electron beam resist;
      curing, by baking, a portion of the shrink agent in contact with the first electron beam resist, the second electron beam resist, and the third electron beam resist; and
      removing an uncured portion of the shrink agent.

3. The method of manufacturing a semiconductor device according to claim 2, wherein a temperature of the baking is 120° C. or more and 250° C. or less.

4. The method of manufacturing a semiconductor device according to claim 1, wherein the shrink agent contains a polyvinyl-based alcohol derivative.

5. The method of manufacturing a semiconductor device according to claim 1, wherein a width of the first opening is 150 nm or less.

6. The method of manufacturing a semiconductor device according to claim 1, further comprising:
   forming an Au film over the Ni film after the forming the Ni film.

7. The method of manufacturing a semiconductor device according to claim 6, further comprising:
   removing the first electron beam resist, the second electron beam resist, the third electron beam resist, and the shrink agent after the forming the Au film.

8. The method of manufacturing a semiconductor device according to claim 1, further comprising:
   forming a protective film on the semiconductor layer prior to the forming the first electron beam resist, the second electron beam resist, and the third electron beam resist; and
   forming, in the protective film, a fourth opening communicating with the first opening between the forming the film of the shrink agent and the forming the Ni film,
   wherein the Ni film is in contact with the semiconductor layer through the first opening and the fourth opening.

9. A method of manufacturing a semiconductor device, the method comprising:
   forming, on a GaN-based semiconductor layer, a protective film;
   forming, on the protective film, a first electron beam resist, a second electron beam resist, and a third electron beam resist, at least one of the first electron beam resist and the third electron beam resist containing chlorine;
   forming a first opening in the first electron beam resist, a second opening in the second electron beam resist, and a third opening in the third electron beam resist, wherein the first opening exposes a portion of a surface of the protective layer, the second opening is larger in width than the first opening, and the third opening is larger in width than the first opening and smaller in width than the second opening;
   forming a film of a shrink agent that covers an upper surface of the third electron beam resist and each of sidewall surfaces of the first opening, the second opening, and the third opening, and that contains a polyvinyl-based alcohol derivative;

forming, in the protective film, a fourth opening communicating with the first opening;

forming, in a state in which the sidewall surfaces are covered by the film of the shrink agent, a Ni film that contacts the semiconductor layer through the first opening and the fourth opening;

forming an Au film over the Ni film; and removing the first electron beam resist, the second electron beam resist, and the third electron beam resist, and the shrink agent after the forming the Au film, wherein a width of the first opening is 150 nm or less, and wherein the forming the film of the shrink agent includes applying the shrink agent to fill the first opening, the second opening, and the third opening, and to cover the upper surface of the third electron beam resist;

curing, by baking at a temperature of 140° C. or more and 160° C. or less, a portion of the shrink agent in contact with the first electron beam resist, the second electron beam resist, and the third electron beam resist; and removing an uncured portion of the shrink agent.

\* \* \* \* \*